United States Patent

Davidson

[11] Patent Number: 5,379,206
[45] Date of Patent: Jan. 3, 1995

[54] LOW LOSS SNUBBER CIRCUIT WITH ACTIVE RECOVERY SWITCH

[75] Inventor: Christopher D. Davidson, Surrey, Canada

[73] Assignee: Argus Technologies, Ltd., Burnaby, Canada

[21] Appl. No.: 985,809

[22] Filed: Dec. 2, 1992

[51] Int. Cl.[6] .......................... H02H 7/122
[52] U.S. Cl. ............................ 363/55; 363/20; 363/131
[58] Field of Search .......... 363/20, 21, 24, 25, 363/26, 55, 56, 131, 134

[56] References Cited

U.S. PATENT DOCUMENTS

| | | | |
|---|---|---|---|
| 4,336,507 | 6/1982 | Boettcher et al. | 363/134 |
| 4,365,171 | 12/1982 | Archer | 307/253 |
| 4,438,486 | 3/1984 | Ferraro | 363/56 |
| 4,502,085 | 2/1985 | Morrison et al. | 361/56 |
| 4,561,046 | 12/1985 | Kuster | 363/21 |
| 4,652,809 | 3/1987 | Barn | 363/56 |
| 4,675,796 | 6/1987 | Gautherin et al. | 363/20 |
| 4,691,270 | 9/1987 | Pruitt | 363/56 |
| 4,772,810 | 9/1988 | Felps | 307/253 |
| 4,876,635 | 10/1989 | Park et al. | 363/17 |
| 5,014,180 | 5/1991 | Nuechterlein | 363/56 |
| 5,019,770 | 5/1991 | Harada et al. | 363/134 |
| 5,055,991 | 10/1991 | Carroll et al. | 363/56 |
| 5,075,838 | 12/1991 | Schnetzka, II et al. | 363/37 |
| 5,260,607 | 11/1993 | Kinbara | 363/56 |

OTHER PUBLICATIONS

Steit and Tollik; "High Efficiency Telecom Rectifier Using A Novel Soft-Switched Boost-Based Input Current Shaper"; (Nov. 1991) Intelec '91; pp. 720–726.

*Primary Examiner*—Jeffrey L. Sterrett
*Attorney, Agent, or Firm*—Fulwider, Patton, Lee & Utecht

[57] ABSTRACT

A switch mode power converter includes a snubber diode and a snubber capacitor arranged in series with one another across the switching element of the converter. A discharge path is provided for discharging the capacitor by including a second diode, a switch and an inductor extending in series from the node between the snubber diode and the snubber capacitor to the line side of the transformer. The inductor may be coupled to a winding in series with a diode to allow clamping of the voltage across the inductor.

1 Claim, 4 Drawing Sheets

1

LOW LOSS SNUBBER CIRCUIT WITH ACTIVE RECOVERY SWITCH

FIELD OF THE INVENTION

This invention relates to snubber circuits for minimizing energy losses across the switching elements of switchmode power supply converters.

BACKGROUND OF THE INVENTION

It is desirable to use a snubber circuit across the switching elements (bipolar, FET or IGBT transistors) of switchmode power supply converters to reduce the energy stress on the switching device, to reduce power loss and to minimize the rate of change of turn off voltage to thereby minimize EMI generation and inductive overshoot.

A conventional approach for minimizing switching losses is to place a resistor in series with a capacitor across the switching element. Such an arrangement provides both turn off snubbing and damping of voltage oscillations across the switching element but it incurs a relatively high power loss.

An alternative approach is to place a diode in series with a capacitor across the switching element as for example in Schnetzka, II et al. U.S. Pat. No. 5,075,838 and Pruitt U.S. Pat. No. 4,691,270. Recovery of the energy stored in the capacitor may be achieved by providing a discharge path through a transformer as best illustrated in Pruitt. However, the approaches used in Pruitt and Schnetzka cannot practically be used with single switch forward, flyback or duty converters at high frequency of operating currents and high duty cycles.

It is therefore an object of this invention to provide an improved snubber circuit which features low loss recovery of the energy absorbed by the snubber suitable for single or two switch forward, flyback, duty or other isolated converters.

It is also an object of the invention to provide such an improved snubber circuit wherein the snubber capacitor and the series diode can be placed directly across the switching element as is desired when using very high speed switching elements.

SUMMARY OF THE INVENTION

In one of its aspects, the invention consists of a switchmode power converter including a circuit for achieving low loss snubbing across the switching element. The switchmode power converter includes a transformer and a switching element in series with one of the transformer windings. A snubber diode and a snubber capacitor are arranged in series with one another across the switching element. A discharge path is provided for discharging the capacitor including a second diode, a switch and an inductor extending in series from the node between the snubber diode and the snubber capacitor.

In another of its aspects, the invention consists of a snubber diode and a snubber capacitor in series with one another across the switching element, a discharge path for discharging the capacitor including a second diode, a switch and an inductor extending in series from the node between the snubber diode and the snubber capacitor to the line side of the transformer, a winding coupled to the inductor, a third diode in series with the winding, the series extending between the line side of the switching element and the line side of the transformer, and a third transformer winding in series with the discharge path.

DESCRIPTION OF THE DRAWINGS

The invention may be best understood by reference to the following description in conjunction with the accompanying drawings in which.

DETAILED DESCRIPTION OF THE INVENTION

Figure 1:
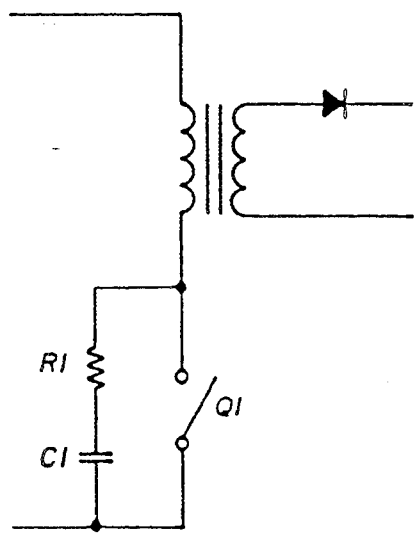
FIG. 1 illustrates a simple prior art RC snubber.

FIG. 1 illustrates a prior art approach to snubbing whereby a resistor R1 in series with a capacitor C1 are placed across the switching element Q1. Such an approach provides basic snubbing across the switch but it incurs a power loss calculated as $P = CV^2 f$.

Figure 2:
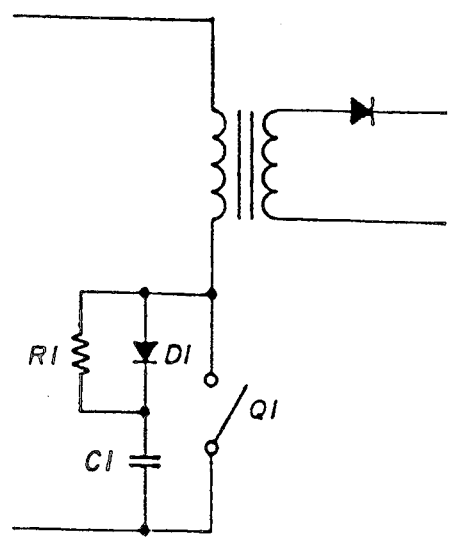
FIG. 2 illustrates a prior art RCD snubber.

A more efficient and commonly used snubbing circuit is shown in FIG. 2. The circuit uses a diode D1 across the resistor R1 to allow the capacitor C1 to more efficiently take over the current from the switching element Q1 and to reduce the power loss to $P = 1/2 CV^2 f$.

Figure 3:
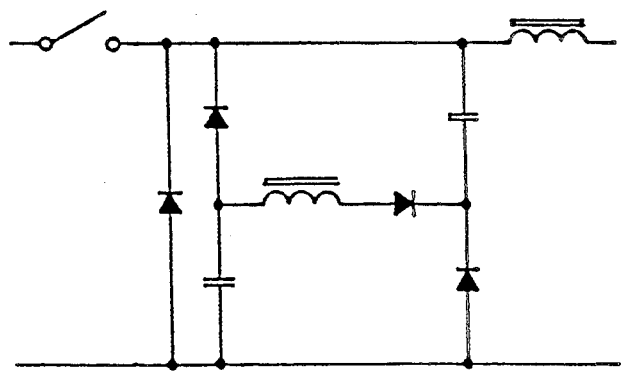
FIG. 3 illustrates a prior art snubber circuit employed with switching regulators.

Low loss snubbers have been employed with switching regulators as shown in FIG. 3 with two sets of series capacitors and diodes reset by a series inductor and diode for "lossless" resetting of the snubber capacitors. This circuit is not applicable to isolated converters.

Figure 4:
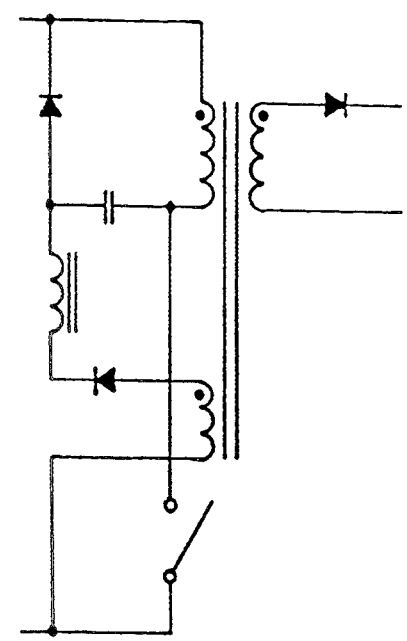
FIG. 4 illustrates a prior art snubber circuit used in isolated forward converters with the snubber capacitor and diode across a transformer winding.

The inventor has previously invented and has long used a low loss snubber as illustrated in FIG. 4 in isolated converters operating up to 75% duty cycle. However, it is not possible with the circuit of FIG. 4 to place the snubber capacitor and the main diode across the switching element rather than across the transformer winding. Thus optimum suppression of EMI particularly with very high speed turn off devices required for converters operating in the 100 kHz range and higher is not realizable.

Figure 5:
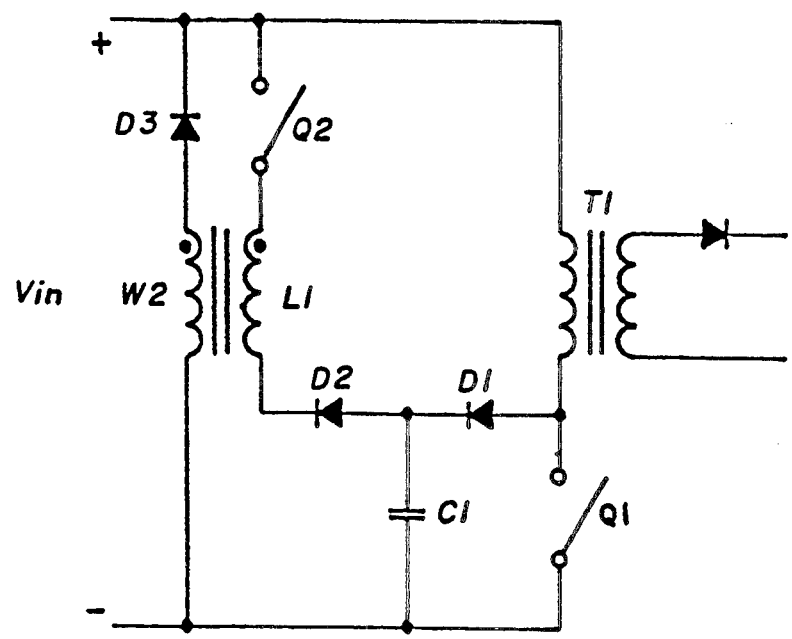
FIG. 5 illustrates a low loss snubber with active reset switch according to the invention.

The basic circuit according to the invention is illustrated in FIG. 5. A main transformer T1 in conjunction with the operation of switch Q1 provide power conversion.

A diode D1 and a capacitor C1 are placed across the switching element Q1 to provide a current path when switch Q1 is opened. A discharge path is provided to discharge capacitor C1 when Q1 is closed. The discharge path consists of diode D2 in series with inductor L1 and active reset switch Q2. The discharge path is used with switch Q2 to reset the snubber capacitor C1 while Q1 is closed. The discharge path returns the stored energy from the capacitor to the input.

Switch Q2 is operated to close as Q1 closes or a very short time after Q1 is closed. Turning on Q2 causes a voltage to be impressed across L1 and D2 to cause C1 to discharge. When the voltage on C1 reaches the positive input potential Vin, the polarity of the inductor voltage reverses and its stored energy is used to continue to discharge C1. Eventually, C1 will be completely discharged.

Ideally, capacitor C1 will discharge completely before Q1 reopens thereby enabling the operation of Q2 to be synchronized with Q1. However, with narrow duty cycles, this may not be the case. Accordingly, the circuit of FIG. 5 also includes a second winding W2 associated with inductor L1 to allow clamping of the voltage across the inductor (as well as switch Q2 and diode D2) in the event that switch Q2 is turned off while current is still flowing in the first winding of the inductor.

Figure 6:
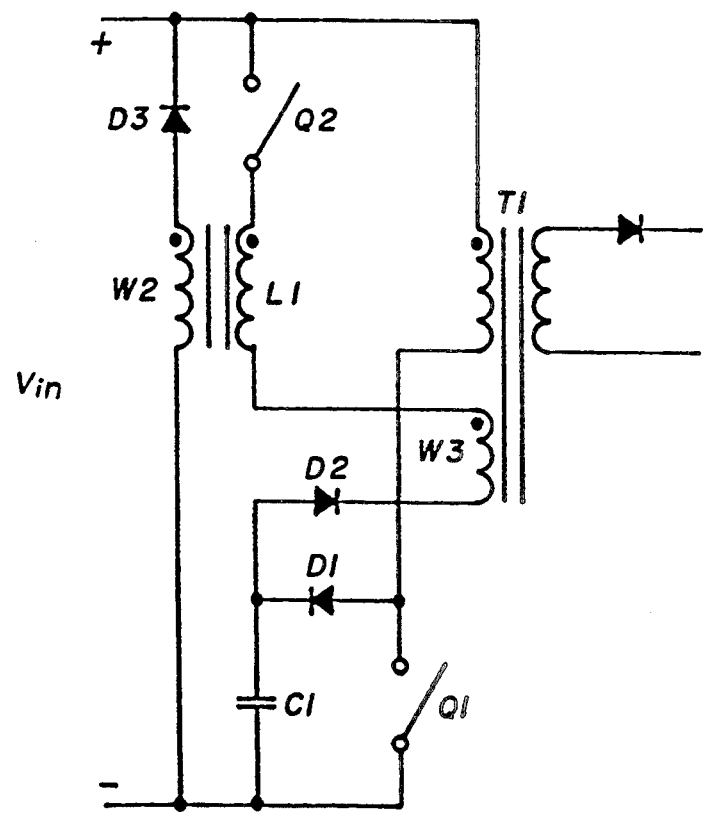
FIG. 6 illustrates a low loss snubber circuit with active reset switch which can be used where the switch duty cycle can be greater than 50%.

With duty cycles of greater than 50%, it may be only possible to charge C1 to a voltage less than the forward voltage while Q1 is open. As a result, the potential available between Vin and C1 may not be sufficient to induce a discharge of C1 to zero before Q1 reopens. The circuit of FIG. 6 provides a solution to that problem by way of a third winding W3 added to transformer T1. This third winding may be in the power transformer of the converter as illustrated in FIG. 6. W3 is placed in series with inductor L1 and diode D2. When Q1 is closed, the switch current through T1 induces an additional voltage component in the discharge path and additional current to ensure complete discharge of C1.

Figure 7:
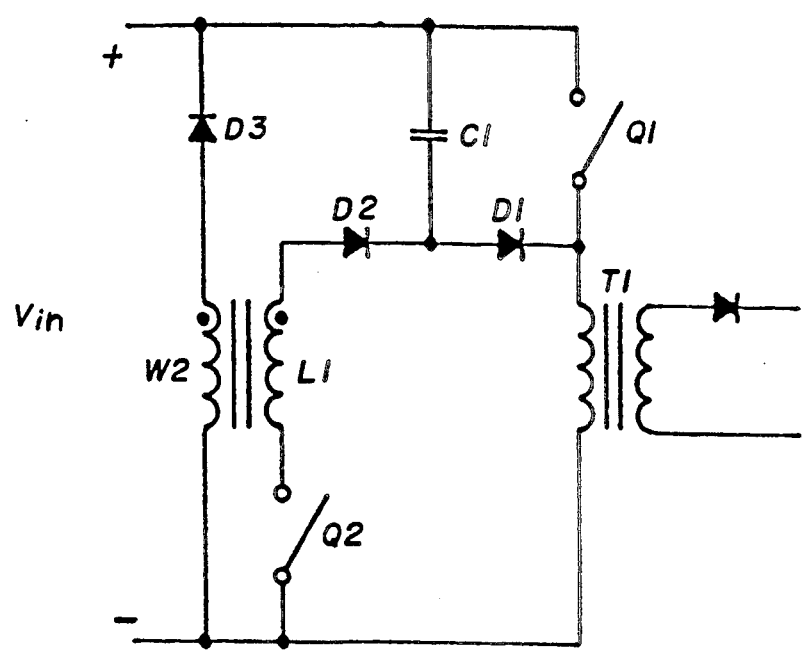
FIG. 7 illustrates a low loss snubber according to the invention wherein the switching element is on the "high" side of the transformer.
Figure 8:
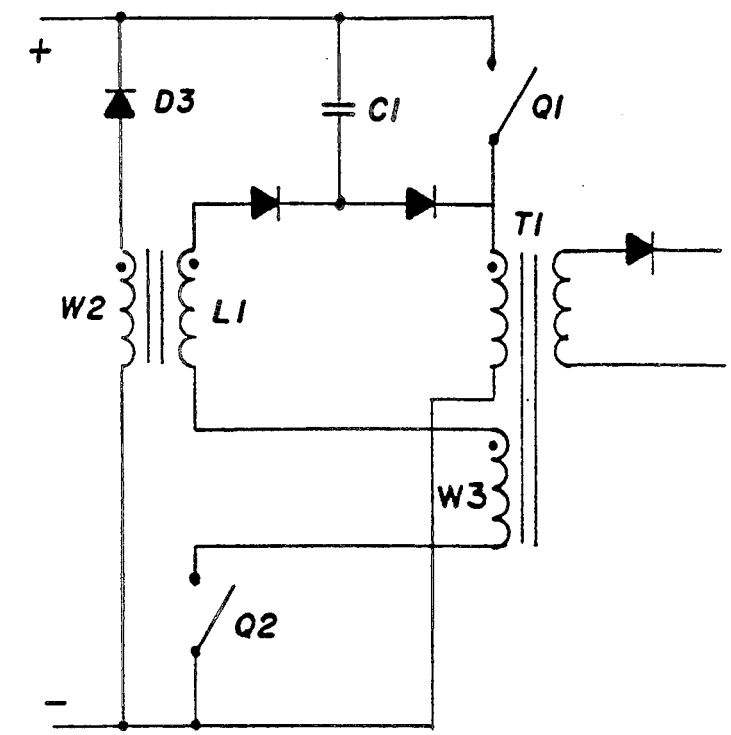
FIG. 8 illustrates a low loss snubber according to the invention which can be used for a high side switch converter where the duty cycle can be greater than 50%; and, FIG. 9 illustrates a low loss snubber according to the invention as applied to a two switch converter.
Figure 9:
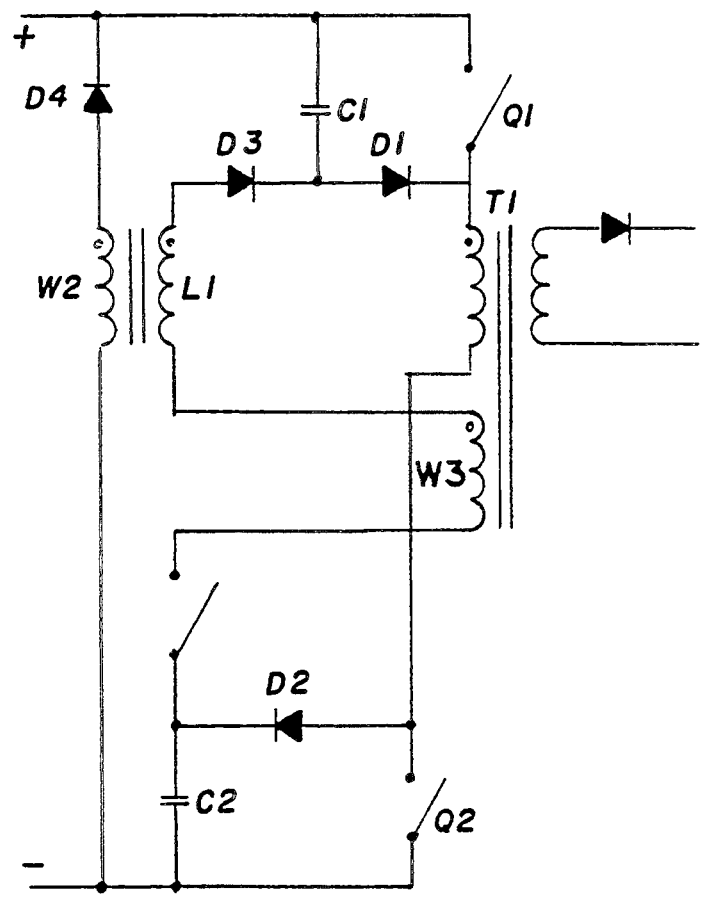

Other embodiments of the invention are possible without departing from the substance thereof. For example, where the main switch is on the high side of the transformer, the circuit of FIG. 7 may be used, and where the switch duty cycle can be greater than 50%, the circuit of FIG. 8 can be used to ensure complete discharge of the snubber capacitor. Where a two switch converter is used, the circuit of FIG. 9 may be used, which is illustrated as including a third transformer winding in the discharge path for duty cycles of greater than 50%, as well as snubber diodes and capacitors for each switching element.

It will also be appreciated by those skilled in the art to which this invention applies that additional electrical and electronic components may be added to the circuits of the invention or that electrical equivalents may be used without departing from the operation or the principles of the invention.

What is claimed is:

1. A switchmode power converter including a circuit for achieving low loss snubbing across the switching element comprising:

a transformer with at least two windings and the primary of which transformer has a switching element side and a line side;

a switching element in series with the primary winding, said switching element having a transformer side of the switching element and a line side of the switching element;

a snubber diode and a snubber capacitor in series with one another across the switching element;

a discharge path for discharging the capacitor including a second diode, a switch and an inductor, said discharge path extending from the node between the snubber diode and the snubber capacitor to the line side of the primary of the transformer;

a winding coupled to the inductor, said winding being in series with a third diode and said winding and third diode in series extending between the line side of the switching element and the line side of the transformer; and a third winding of the transformer in series with the discharge path.

* * * * *